(12) United States Patent
Nemoto (10) Patent No.: US 7,579,204 B2
(45) Date of Patent: Aug. 25, 2009

(54) METHOD OF PRODUCTION OF SEMICONDUCTOR LIGHT EMISSION DEVICE AND METHOD OF PRODUCTION OF LIGHT EMISSION APPARATUS

(75) Inventor: Kazuhiko Nemoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 459 days.

(21) Appl. No.: 11/331,398

(22) Filed: Jan. 12, 2006

(65) Prior Publication Data

US 2006/0166391 A1    Jul. 27, 2006

(30) Foreign Application Priority Data

Jan. 26, 2005 (JP) ............................. 2005-018369
Jan. 26, 2005 (JP) ........................... P2005-018368

(51) Int. Cl.
*H01L 21/00* (2006.01)

(52) U.S. Cl. ......................................... 438/35; 438/34

(58) Field of Classification Search ................. 438/28, 438/35, 47, 34, 33, 956; 257/88–90, 99, 257/96

See application file for complete search history.

(56) References Cited

U.S. PATENT DOCUMENTS

| | | | |
|---|---|---|---|
| 6,778,578 B2 * | 8/2004 | Lee et al. ....................... | 372/68 |
| 2001/0038101 A1 * | 11/2001 | Nemoto ....................... | 257/89 |
| 2004/0208209 A1 * | 10/2004 | Okazaki ....................... | 372/36 |

* cited by examiner

*Primary Examiner*—Wai-Sing Louie
*Assistant Examiner*—Bilkis Jahan
(74) *Attorney, Agent, or Firm*—Sonnenschein Nath & Rosenthal LLP (57) ABSTRACT

A method of production of semiconductor light emission devices for forming stripes of two multilayers having different emission wavelengths on a substrate, including the steps of: depositing a first multilayer including an active layer on the substrate; selectively etching the first multilayer to form a plurality of adjoining pairs of stripes of the first multilayer; depositing a second multilayer including an active layer on the substrate and the stripes of the first multilayer; selectively etching the second multilayer to form a plurality of adjoining pairs of stripes of the second multilayer on the substrate between the stripes of the first multilayer; and dividing the substrate between adjoining pairs of stripes of the first multilayer and between adjoining pairs of stripes of the second multilayer to divide it into semiconductor light emission devices provided with a stripe of the first multilayer and the second multilayer having different emission wavelengths.

8 Claims, 12 Drawing Sheets

METHOD OF PRODUCTION OF SEMICONDUCTOR LIGHT EMISSION DEVICE AND METHOD OF PRODUCTION OF LIGHT EMISSION APPARATUS

CROSS REFERENCES TO RELATED APPLICATIONS

The present invention contains subject matter related to Japanese Patent Application No. 2005-018368 and No. 2005-018369 filed in the Japan Patent Office on Jan. 26, 2005, the entire contents of which being incorporated herein by reference.

BACKGROUND OF THE INVENTION

1. Field of the Invention

The present invention relates to a method of production of a semiconductor light emission device and a method of production of a light emission apparatus, more particularly relates to a method of production of a semiconductor light emission device provided with a plurality of multilayers emitting lights having different wavelengths and a light emission apparatus mounting the semiconductor light emission device in a package.

2. Description of the Related Art

In general, an apparatus for reading (reproducing) information recorded on a compact disc (CD), digital versatile disc (DVD), mini disc (MD), or other optical recording medium for optically recording information (hereinafter also referred to as an "optical disc") or writing (recording) information on them (hereinafter also referred to as an "optical disc apparatus") includes a built-in optical pickup apparatus.

In the above optical disc apparatuses or optical pickup apparatuses, in general, when the types of the optical discs (optical disc systems) are different, use is made of laser beams having different wavelengths. For example, a laser beam having a wavelength of the 780 nm band is used for the reproduction etc. of a CD, while a laser beam having a wavelength of the 650 nm band is used for the reproduction etc. of a DVD.

With the wavelengths of the laser beams differing according to the types of the optical discs as described above, for example, a compatible optical pickup apparatus enabling the reproduction of a CD in an optical disc apparatus for a DVD has been demanded.

A monolithic two-wavelength laser mounting a laser diode for a CD (emission wavelength: 780 nm) and a laser diode for a DVD (emission wavelength: 650 nm) on a single chip is widely used for constructing a compatible optical pickup apparatus enabling the reproduction of a CD and DVD described above. Greater reduction of the size and reduction of the cost of the chip have been demanded (see for example Japanese Patent Publication (A) No. 2000-244060, Japanese Patent Publication (A) No. 2001-77457, and Japanese Patent Publication (A) No. 2001-244546).

In the above monolithic two-wavelength laser, a first multilayer material emitting light having a first wavelength is formed by crystal growth on a flat substrate, then is etched away at periodic intervals to form stripes of the first multilayer. After this, a second multilayer material emitting light having a second wavelength is formed by crystal growth on the substrate with the relief shapes formed by the stripes of the first multilayer and unnecessary parts are etched away to form stripes of the second multilayer between the stripes of the first multilayer.

SUMMARY OF THE INVENTION

In the crystal growth of the second multilayer material described above, the quality, uniformity, etc. of the crystals grown between the stripes (in the valleys) of the first multilayer become extremely important for the function for emitting the second light.

Ordinarily, when the area of such a valley portion becomes narrow, the quality, uniformity, etc. of the crystals are degraded. Therefore, when considering the yield and the uniformity of characteristics of the laser, a certain extent of area becomes necessary. It is therefore difficult to further reduce the chip size (width) in actual circumstances.

The inventors found that the above difficulty can be overcome by changing the order of arrangement of the stripes of two types of multilayers. In this case, however, two types of semiconductor light emission devices with reverse arrangements of the two types of multilayers constituting the light emission regions are formed. For this reason, when mounting the two types of semiconductor light emission devices in a package, some means for making them substantially the same light emission apparatuses becomes necessary.

It is therefore first desirable to provide a method of production of a semiconductor light emission device able to reduce the size of the device while maintaining the uniformity of characteristics and the yield. It is second desirable to provide a method of production of a semiconductor light emission device able to improve the uniformity of characteristics and yield without changing the size of the device. It is third desirable to provide a method of production of a light emission apparatus able to produce substantially the same light emission apparatuses when mounting two types of semiconductor light emission devices having reverse arrangements of the two light emission regions having different emission wavelengths in a package.

According to a first aspect of the present invention, there is provided a method of production of semiconductor light emission devices for forming stripes of two multilayers having different emission wavelengths on a substrate, including the steps of: depositing a first multilayer including an active layer on the substrate; selectively etching the first multilayer to form a plurality of adjoining pairs of stripes of the first multilayer; depositing a second multilayer including an active layer on the substrate and the stripes of the first multilayer; selectively etching the second multilayer to form a plurality of adjoining pairs of stripes of the second multilayer on the substrate between the stripes of the first multilayer; and dividing the substrate between adjoining pairs of stripes of the first multilayer and between adjoining pairs of stripes of the second multilayer to divide it into semiconductor light emission devices provided with stripes of the first multilayers and the second multilayers having different emission wavelengths.

According to a second aspect of the present invention, there is provided a method of production of semiconductor light emission devices for forming stripes of a plurality of multilayers having different emission wavelengths in semiconductor light emission device regions of a substrate and dividing the substrate between the semiconductor light emission device regions to form a plurality of semiconductor light emission devices, wherein the process of forming stripes of the plurality of multilayers includes repeating a depositing step of depositing a multilayer including an active layer on the substrate and a processing step of processing the multilayer to form stripes of the multilayer and reversing the arrangements of stripes of a plurality of multilayers having different emission wavelengths in adjoining pairs of semiconductor light emission device regions to form pairs of stripes of the multilayers having the same emission wavelength adjacent to each other between the semiconductor light emission device regions.

According to a third aspect of the present invention, there is provided a method of production of light emission apparatuses including the steps of: producing a first semiconductor light emission device having two light emission regions having different emission wavelengths and a second semiconductor light emission device having a reverse arrangement of two light emission regions to that of the first semiconductor light emission device; mounting the first semiconductor light emission device in a first package to produce a first light emission apparatus; and inverting the second semiconductor light emission device so that the same arrangement of the two light emission regions as that in the first light emission apparatus is obtained and mounting it in a second package to produce a second light emission apparatus.

According to the method of production of the semiconductor light emission device of the present invention, the size of the device can be reduced while maintaining the uniformity of characteristics and yield. Alternatively, according to the method of production of the semiconductor light emission device of the present invention, the uniformity of characteristics and yield can be improved without changing the size of the device. According to the method of production of the light emission apparatus of the present invention, when mounting two types of semiconductor light emission devices with reverse arrangements of two light emission regions having different emission wavelengths in packages, it is possible to produce light emission apparatuses with the same arrangements of light emission regions and therefore possible to produce substantially the same light emission apparatuses.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

Figure 1:
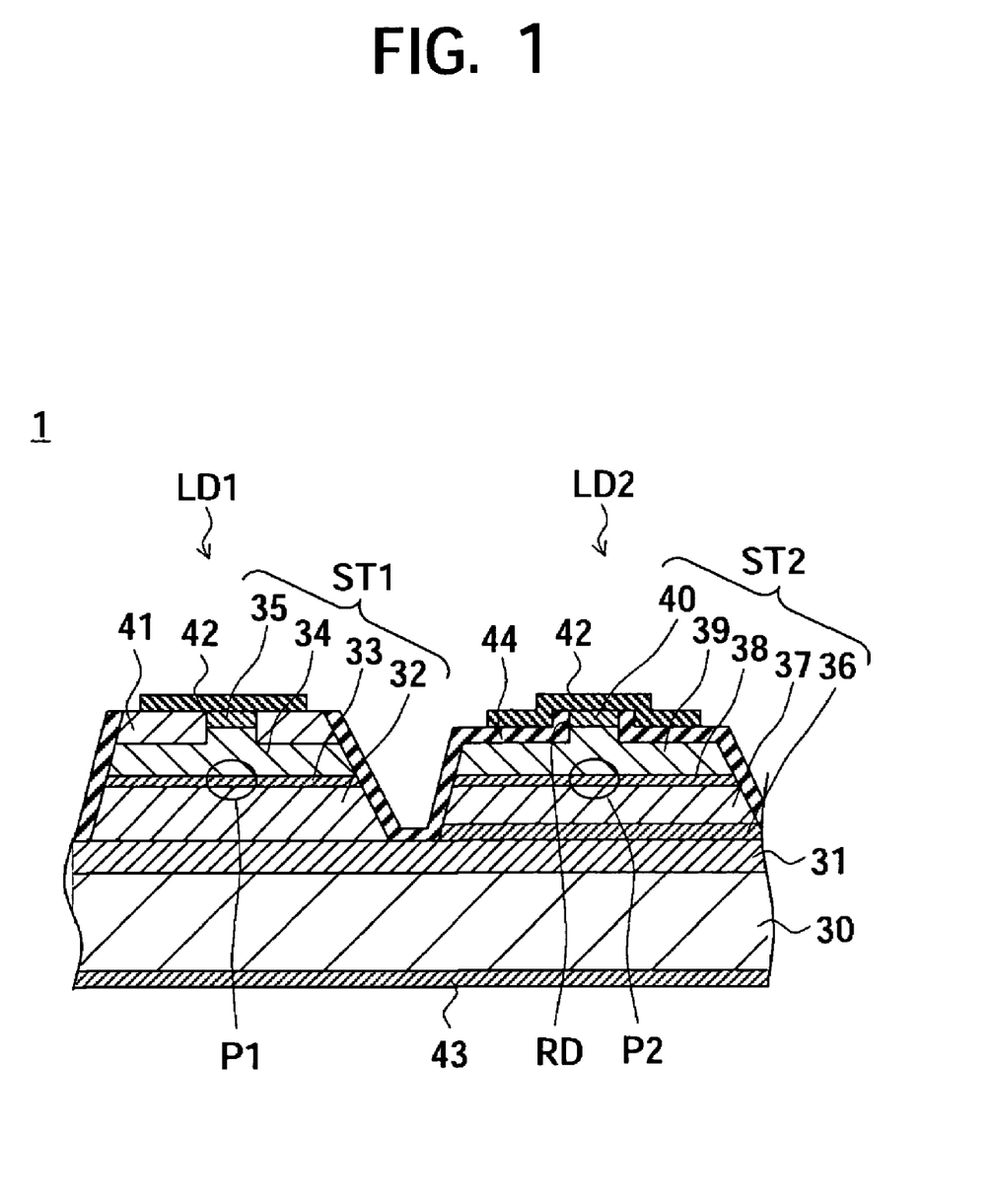
FIG. 1 is a sectional view of a semiconductor light emission device according to an embodiment of the present invention.

FIG. 1 is a sectional view of a semiconductor light emission device according to the present embodiment.

A semiconductor light emission device 1 according to the present embodiment is a monolithic laser diode mounting a laser diode LD1 for a CD (emission wavelength: 780 nm) and a laser diode LD2 for a DVD (emission wavelength: 650 nm) on a single chip and is suitable for constructing a compatible optical pickup apparatus enabling the reproduction of a CD and DVD.

The first laser diode LD1 includes an n-type substrate 30 made of for example GaAs on which an an n-type buffer layer 31 made of for example GaAs, an n-type cladding layer 32 made of for example AlGaAs, an active layer (multi quantum well structure) 33, a p-type cladding layer 34 made of for example AlGaAs, and a p-type cap layer 35 made of for example GaAs are formed, whereby a first multilayer ST1 is formed.

Insulated regions 41 are formed from the surface of the p-type cap layer 35 to a depth in the middle of the p-type cladding layer 34, whereby a stripe forming a gain guided type current confined path structure is formed.

The second laser diode LD2 includes of an n-type substrate 30 on which the an n-type buffer layer 31 made of for example GaAs, an n-type buffer layer 36 made of for example InGaP, an n-type cladding layer 37 made of for example AlGaInP, an active layer (multi quantum well structure having an emission wavelength of 650 nm) 38, a p-type cladding layer 39 made of for example AlGaInP, and a p-type cap layer 40 made of for example GaAs are formed, whereby a second multilayer ST2 is formed.

The regions other than the portion for forming a current injection region are removed from the surface of the p-type cap layer 40 to a depth in the middle of the p-type cladding layer 39 to form a current injection region having an upwardly projecting ridge shape RD to form a stripe forming a gain guided type current confined path structure. Further, it is also possible to easily prepare an index guided type, self pulsation type, etc. by the control of the ridge depth, shape, etc.

Further, an insulation film 44 such as silicon oxide is formed covering the first laser diode LD1 and the second laser diode LD2. The insulation film 44 is formed with contact openings for exposing the p-type cap layers 35 and 40. p-side electrodes 42 are formed on the p-type cap layers 35 and 40, and an n-side electrode 43 is formed on a back surface of the n-type substrate 30. Note that the insulation film 44 is not always necessary so long as the portions other than the stripes do not form ohmic contacts.

In the semiconductor light emission device 1 having the above structure, the distance between a light emission region P1 of the first laser diode LD1 and a light emission region P2 of the second laser diode LD2 is set within for example a range of about 200 μm or less (about 100 μm). From the light emission regions P1 and P2, for example a laser beam having a wavelength of the 780 nm band and a laser beam having a wavelength of the 650 nm band are emitted parallel to the substrate and in almost the same direction (almost parallel).

Next, an explanation will be given of the method of production of the semiconductor light emission devices having the above configurations with reference to FIG. 2 to FIG. 5.

Figure 2A:
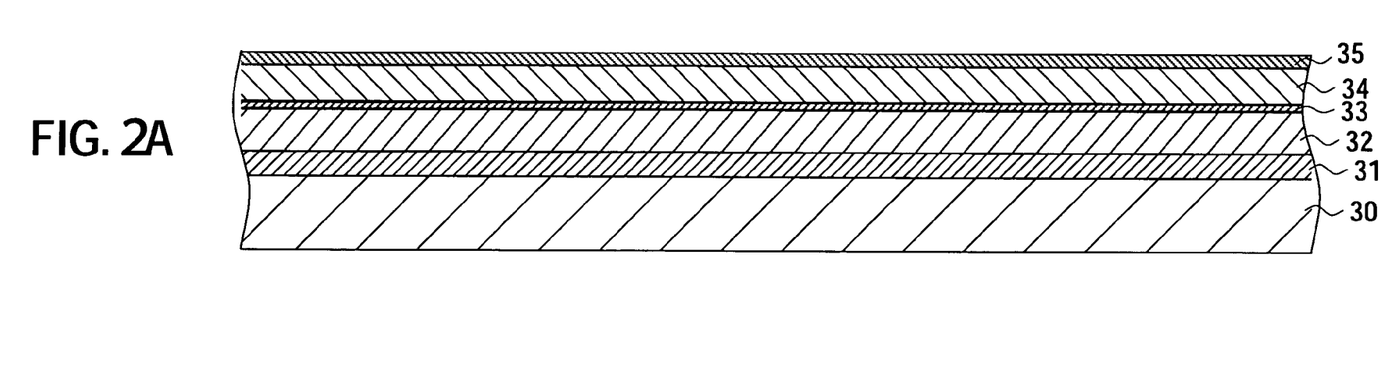
FIGS. 2A and 2B are sectional views of steps in the production of a semiconductor light emission device according to an embodiment of the present embodiment.

First, as shown in FIG. 2A, for example metal organic vapor phase epitaxial growth (MOVPE) or another epitaxial growth method is used to deposit a first multilayer material on a n-type substrate 30 made of for example GaAs. As the first multilayer material, an n-type buffer layer 31 made of for example GaAs, an n-type cladding layer 32 made of for example AlGaAs, an active layer (multi quantum well structure having an emission wavelength of 780 nm) 33, a p-type cladding layer 34 made of for example AlGaAs, and a p-type cap layer 35 made of for example GaAs are stacked in that order.

Figure 2B:
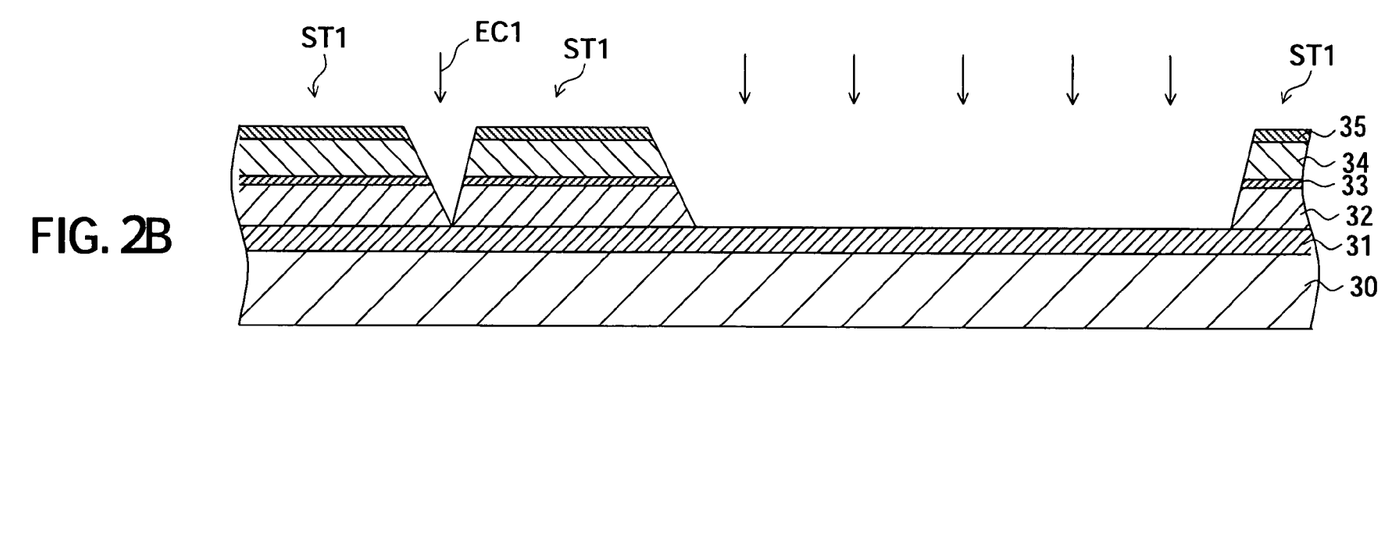

Next, as shown in FIG. 2B, the first multilayer material is processed to form stripes of the first multilayer ST1. In the present embodiment, it is processed so that pairs of stripes of the first multilayer ST1 adjoin each other. Between each two pairs of stripes of the first multilayer ST1, a distance large enough to form two stripes of the second multilayer ST2 is secured. The above processing is carried out by forming for example a resist film having the patterns of the stripes of the first multilayer ST1 and using nonselective etching of a sulfuric acid system and AlGaAs selective etching of a hydrofluoric acid system or other wet etching (EC1) to remove the parts of the first multilayer material other than the regions protected by the resist film down to the n-type cladding layer 32.

Figure 3A:
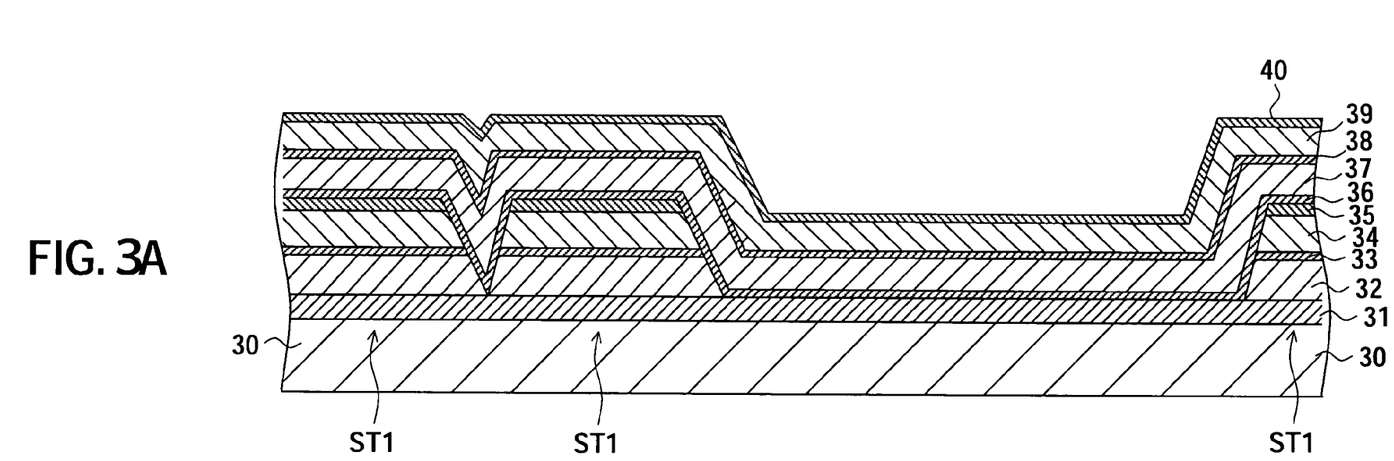
FIGS. 3A and 3B are sectional views of steps in the production of a semiconductor light emission device according to an embodiment of the present embodiment.

Next, as shown in FIG. 3A, for example metal organic vapor phase epitaxial growth (MOVPE) or another epitaxial growth method is used to deposit a second multilayer material on the n-type buffer layer 31 and the stripes of the first multilayer ST1. As the second multilayer material, an n-type buffer layer 36 made of for example InGaP, an n-type cladding layer 37 made of for example AlGaInP, an active layer (multi quantum well structure having an emission wavelength of 650 nm) 38, a p-type cladding layer 39 made of for example AlGaInP, and a p-type cap layer 40 made of for example GaAs are stacked in that order.

Figure 3B:
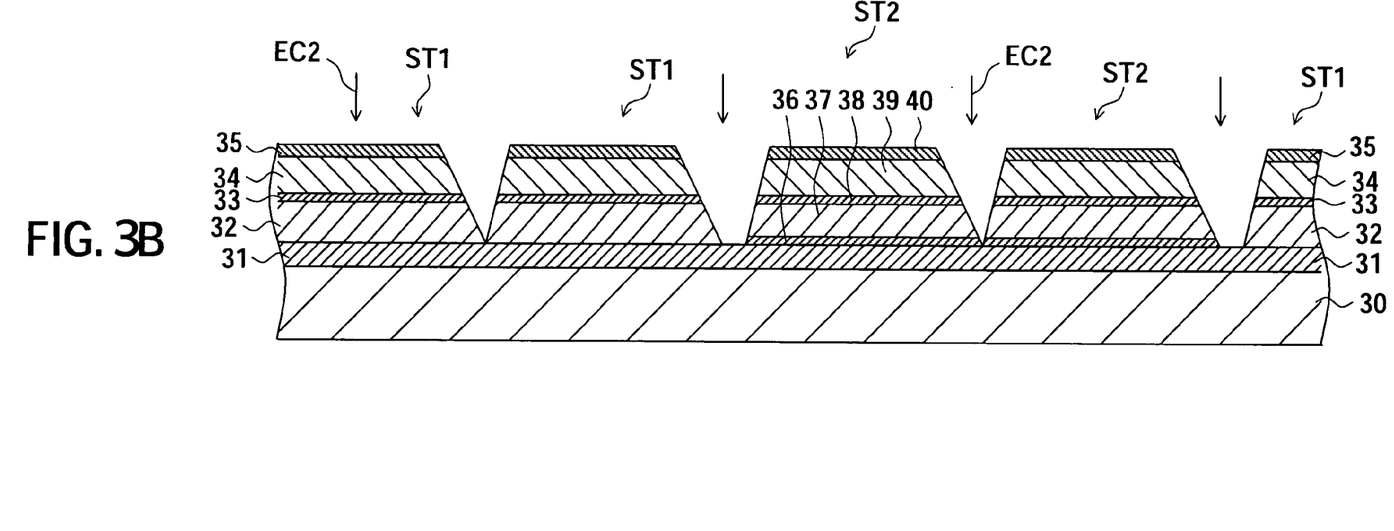

Next, as shown in FIG. 3B, the second multilayer material is processed to form pairs of stripes of the second multilayer ST2 between each two adjoining pairs of stripes of the first multilayer ST1. In the present embodiment, the pairs of stripes of the second multilayer ST2 are processed so as to be adjacent to each other. The above processing is carried out by for example forming a resist film of the patterns of the stripes of the second multilayer ST2 and using cap etching of a sulfuric acid system, four-component selective etching of phosphoric acid and hydrochloric acid systems, separation etching of a hydrochloric acid system, or other wet etching (EC2) to remove the parts of the second multilayer material other than the regions protected by the resist film down to the n-type buffer layer 36.

Figure 4A:
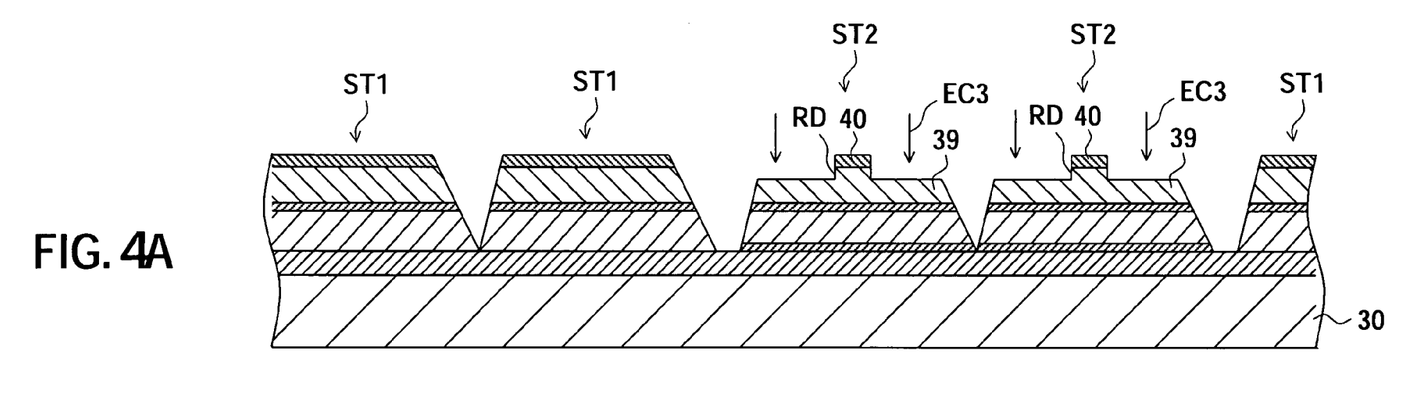
FIGS. 4A and 4B are sectional views of steps in the production of a semiconductor light emission device according to an embodiment of the present embodiment.

Next, as shown in FIG. 4A, a current confined path structure is formed at each stripe of the second multilayer ST2. For example, in a stripe of the second multilayer ST2, regions other than the current injection region are removed from the surface of the p-type cap layer 40 to a depth in the middle of the p-type cladding layer 39 to form a ridge shape RD having an upwardly projecting current injection region to form a gain guided type current confined path structure. The second multilayer ST2 is processed by forming a resist film open at regions to be removed and then using the resist film as the mask for etching (EC3). Thereafter, the resist film is removed.

Figure 4B:
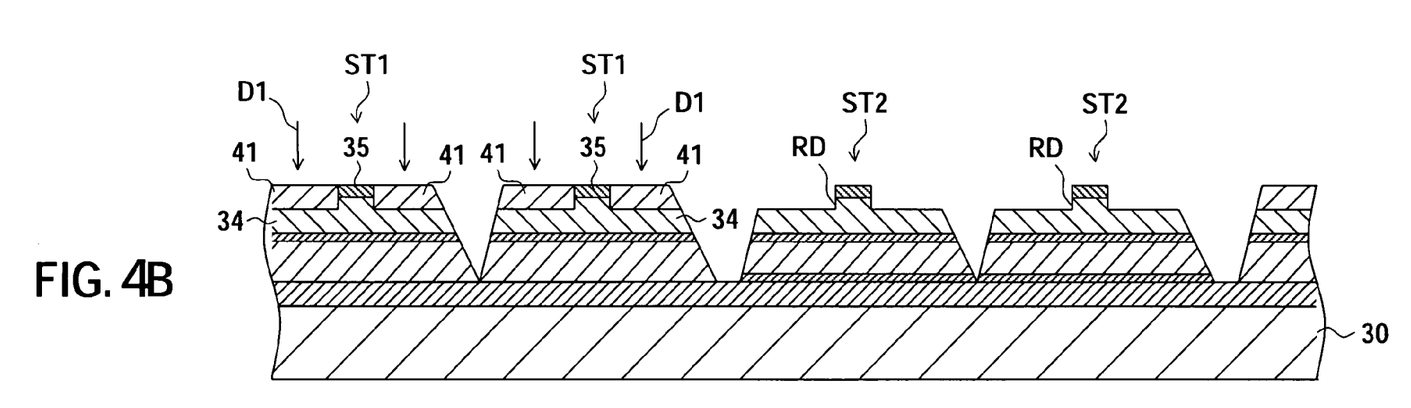

Next, as shown in FIG. 4B, a current confined path structure is formed in each stripe of the first multilayer ST1. For example, an impurity D1 is introduced into the regions other than the current injection regions of the stripes of the first multilayer ST1 by ion implantation or the like to form insulated regions 41 from the surface of the p-type cap layer 35 down to a depth in the middle of the p-type cladding layer 34 and thereby form gain guided type current confined path structures. This process is carried out by forming a resist film open at the ion implantation regions, then implanting ions. Thereafter, the resist film is removed.

Figure 5A:
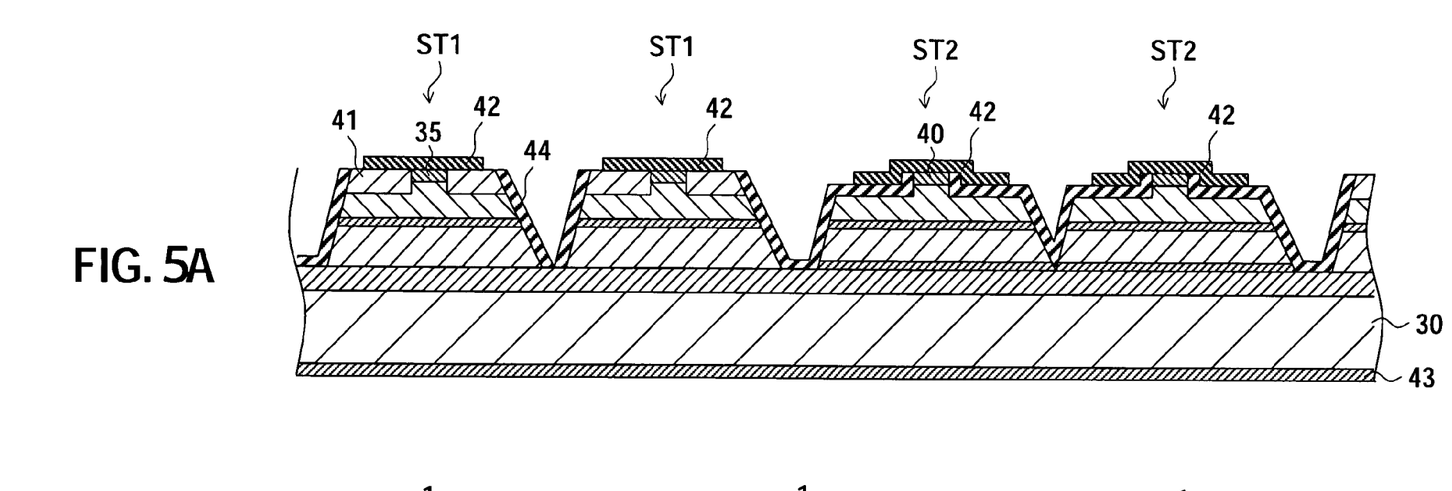
FIGS. 5A and 5B are sectional views of steps in the production of a semiconductor light emission device according to an embodiment of the present embodiment.

Next, as shown in FIG. 5A, silicon oxide is deposited over the entire surface by for example chemical vapor deposition (CVD) to form an insulation film 44 and contact openings are formed for exposing the p-type cap layers 35 and 40. Subsequently, the p-type cap layers 35 and 40 are formed with p-side electrodes 42 such as Ti/Pt/Au, while the back surface side of the n-type substrate 30 is formed with an n-side electrode 43 such as AuGe/Ni/Au.

Figure 5B:
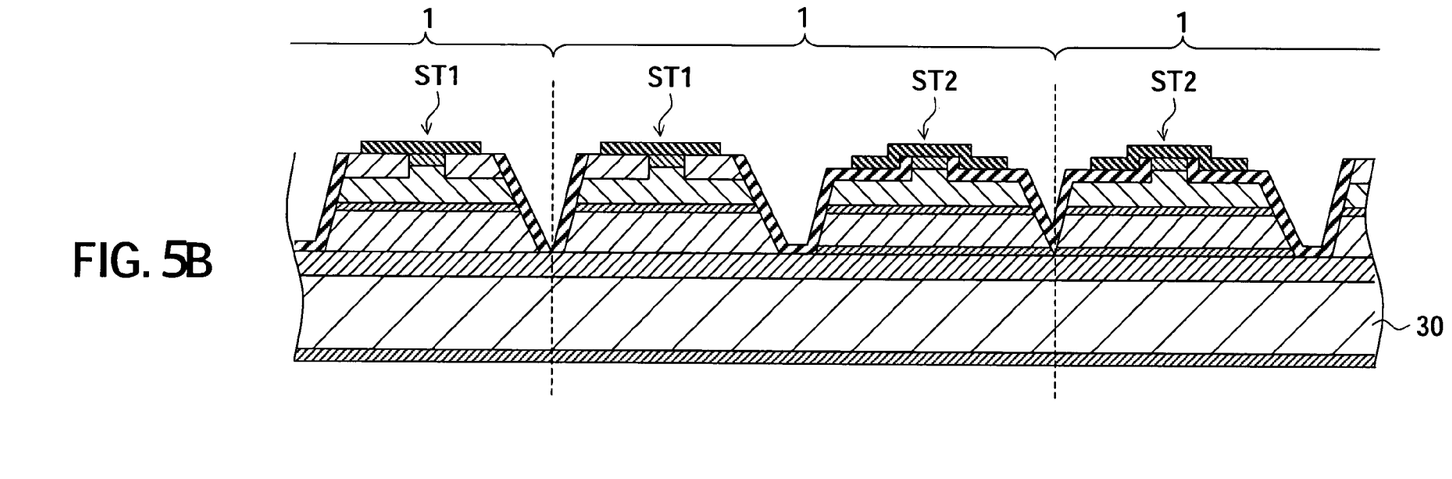

Next, as shown in FIG. 5B, the substrate is cleaved to divide it into semiconductor light emission devices 1. By cleaving the n-type substrate 30 between adjoining pairs of stripes of the first multilayer ST1 and adjoining pairs of stripes of the second multilayer ST2, semiconductor light emission devices 1 provided with a stripe of a first multilayer ST1 and a second multilayer ST2 are formed.

Next, an explanation will be given of the effects of the method of production of the semiconductor light emission device with reference to a comparative example.

Figure 6:
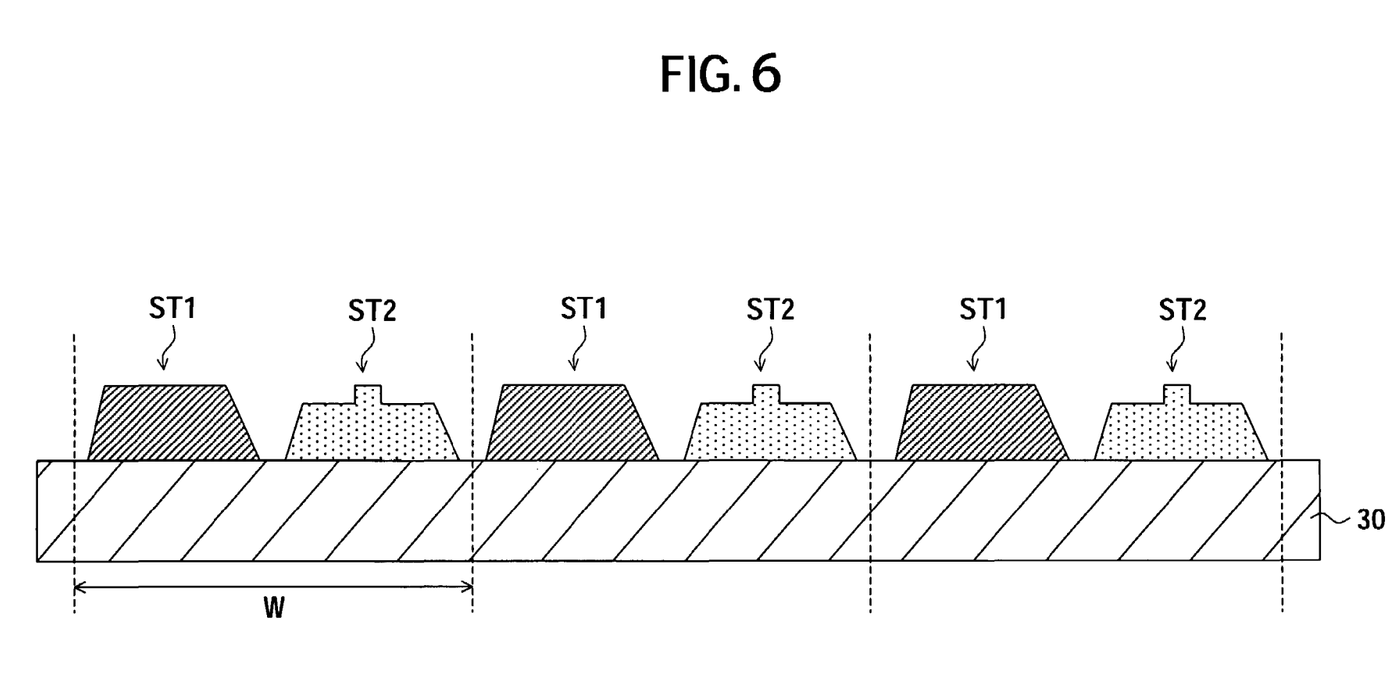
FIG. 6 is a view showing an arrangement of stripes of multilayers on a substrate in the production of a semiconductor light emission device according to a comparative example.
Figure 7:
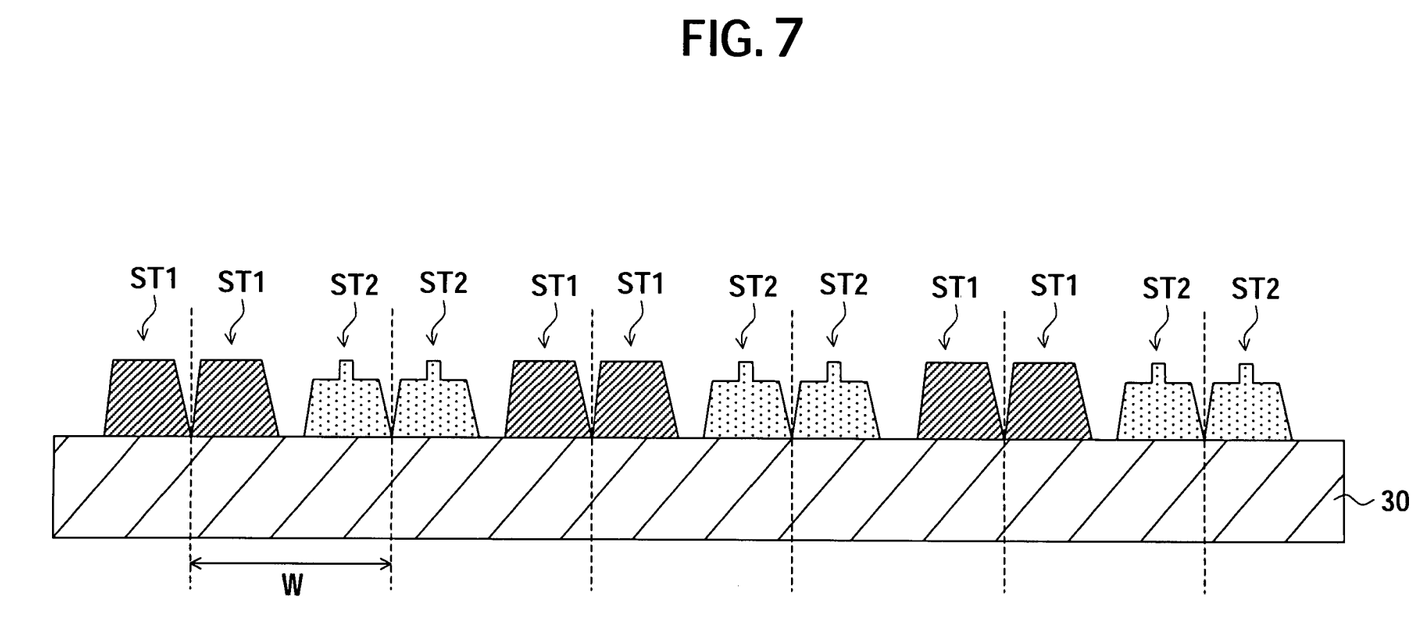
FIG. 7 is a view showing the arrangement of stripes of multilayers on a substrate in the production of a semiconductor light emission device according to an embodiment of the invention.

FIG. 6 is a view showing an arrangement of stripes of multilayers on a substrate in the production of conventional semiconductor light emission devices described in the Japanese Patent Publication (A) No. 2000-244060, Japanese Patent Publication (A) No. 2001-77457, and Japanese Patent Publication (A) No. 2001-244546. FIG. 7 is a view showing the arrangement of stripes of multilayers on a substrate in the production of semiconductor light emission devices according to the embodiment of the present invention.

As shown in FIG. 6, in the past, stripes of the first multilayer ST1 and stripes of the second multilayer ST2 are alternately formed one by one. For this reason, for example, when a chip width of a semiconductor light emission device is W, if assuming that the stripe widths are uniform, the distance between stripes of the first multilayer ST1 in which the second multilayer material is grown becomes W/2.

Contrary to this, in the present embodiment, as shown in FIG. 7, pairs of stripes of first multilayer ST1 are formed so as to adjoin each other, while adjoining pairs of stripes of the second multilayer ST2 are formed between each two adjoining pairs of stripes of the first multilayer ST1. For this reason, for example, when the chip width of a semiconductor light emission device is W, if assuming that the stripe widths are uniform, the distance between stripes of the first multilayers ST1 in which the second multilayer material is stacked becomes W, and an area two times the conventional area can be secured.

As described above, by changing the order of arrangement of the stripes of the first multilayer ST1 and the stripes of the second multilayer ST2 from the conventional order, the area between stripes of the first multilayer ST1 can be made substantially twice the previous size, so it becomes easy to more stably secure the quality, uniformity, etc. of crystals of the second multilayer material. Namely, it becomes possible to reduce the chip size (width) of individual semiconductor light emission devices 1 without degrading the quality, uniformity, etc. of crystals, and the yield from one wafer (n-type substrate 30) can be easily improved. Accordingly, further reduction of size and reduction of cost become possible while keeping the yield and the uniformity of characteristics of the lasers.

Alternatively, the areas for the stripes of the second multilayer material, that is, the areas between stripes of the first multilayer ST1, can be made larger without changing the chip sizes (widths) of the semiconductor light emission devices 1. For this reason, when the chip sizes of the semiconductor light emission devices 1 are the same as the conventional size, it becomes possible to further improve the quality, uniformity, etc. of crystals of the second multilayer material formed by crystal growth between stripes of the first multilayers ST1, and it becomes possible to more stably produce lasers having high yield and uniformity.

Further, in the present embodiment, the chip sizes can be changed by just changing the order of arrangement of stripes of multilayers on the wafer (n-type substrate 30), therefore the effects are also exhibited that design is extremely easy and almost no development costs are incurred.

As shown in FIG. 7, in the method of production of semiconductor light emission devices described above, two types of semiconductor light emission devices having reverse orders of arrangement of stripes of multilayers are produced. Usually, dielectric layers are formed on the end faces of both sides of each semiconductor light emission device 1. When these two dielectric films are the same, the semiconductor light emission devices 1 may be regarded as of one type. However, when the dielectric films are different, the semiconductor light emission devices become two types having reverse arrangements of light emission regions.

In the method of production of light emission apparatuses according to the present embodiment, when two types of semiconductor light emission devices having reverse arrangements of light emission regions are produced, the production of same light emission apparatuses is enabled.

Figure 8:
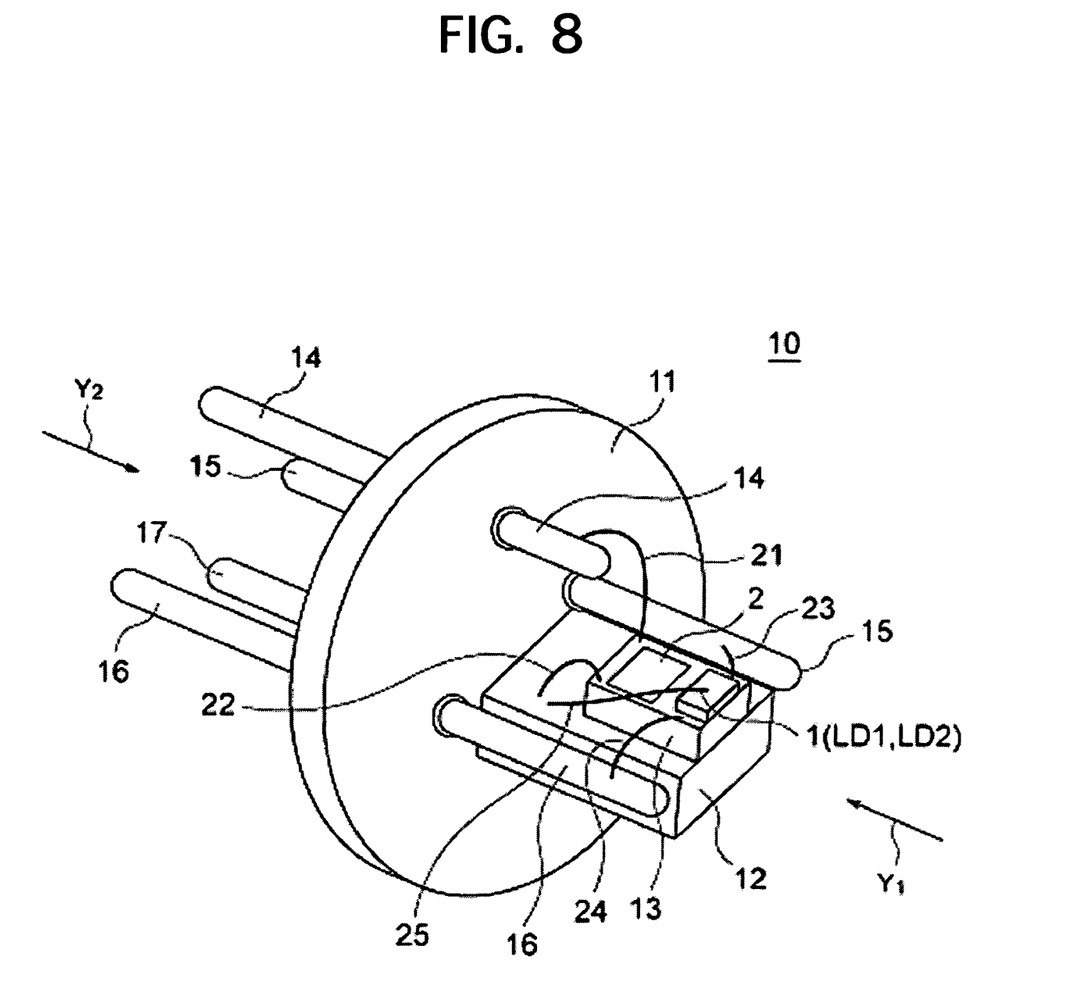
FIG. 8 is a perspective view of a light emission apparatus produced by mounting semiconductor light emission device in a package (first package)

FIG. 8 is a perspective view of a light emission apparatus 1 produced by mounting the semiconductor light emission device 1 in a package (first package). The first package shown in FIG. 8 is a so-called CAN package. In FIG. 8, the side indicated by an arrow Y1 in the figure is the front side (light output side) of the first package, and the side indicated by an arrow Y2 becomes the back side.

A disk-shaped base 11 has a heat sink 12 fixed to it. The heat sink 12 is formed by for example a metal material having a good heat conductivity and low resistance. On the heat sink 12, a sub mount 13 is mounted. On the sub mount 13, a PIN diode 2 forming a monitor use photosensor and a semiconductor light emission device 1 provided with first and second laser diodes LD1 and LD2 are mounted.

The PIN diode 2 senses the laser beams emitted to the rear sides of the first and second laser diodes LD1 and LD2. It is configured to measure the intensities of the laser beams and thereby control the drive currents of the first and second laser diodes LD1 and LD2 so as to give constant intensities of laser beams for automatic power control (APC).

As external terminals, provision is made of a PIN diode use terminal 14 passing through the base 11, an LD1 use terminal 15, and an LD2 use terminal 16. Further, the back surface of the first package is provided with a common terminal 17 connected to the heat sink 12.

One electrode of the PIN diode 2 and the PIN diode use terminal 14 are connected by a lead 21. The other electrode of the PIN diode 2 and the heat sink 12 are connected by a lead 22. Due to this, the other electrode of the PIN diode 2 and the common terminal 17 are connected.

The electrode of the first laser diode LD1 of the semiconductor light emission device 1 and the LD1 use terminal 15 are connected by a lead 23, while the electrode of the second laser diode LD2 and the LD2 use terminal 16 are connected by a lead 24. The common electrode (n side electrode) of the semiconductor light emission device 1 and the heat sink 12 are connected by a lead 25. Due to this, the common electrode of the semiconductor light emission device 1 and the common terminal 17 are electrically connected.

Between the common terminal 17, the PIN diode use terminal 14, the LD1 use terminal 15, and the LD2 use terminal 16, a drive voltage able to drive the semiconductor light emission device 1 and the PIN diode 2 is supplied.

Figure 9:
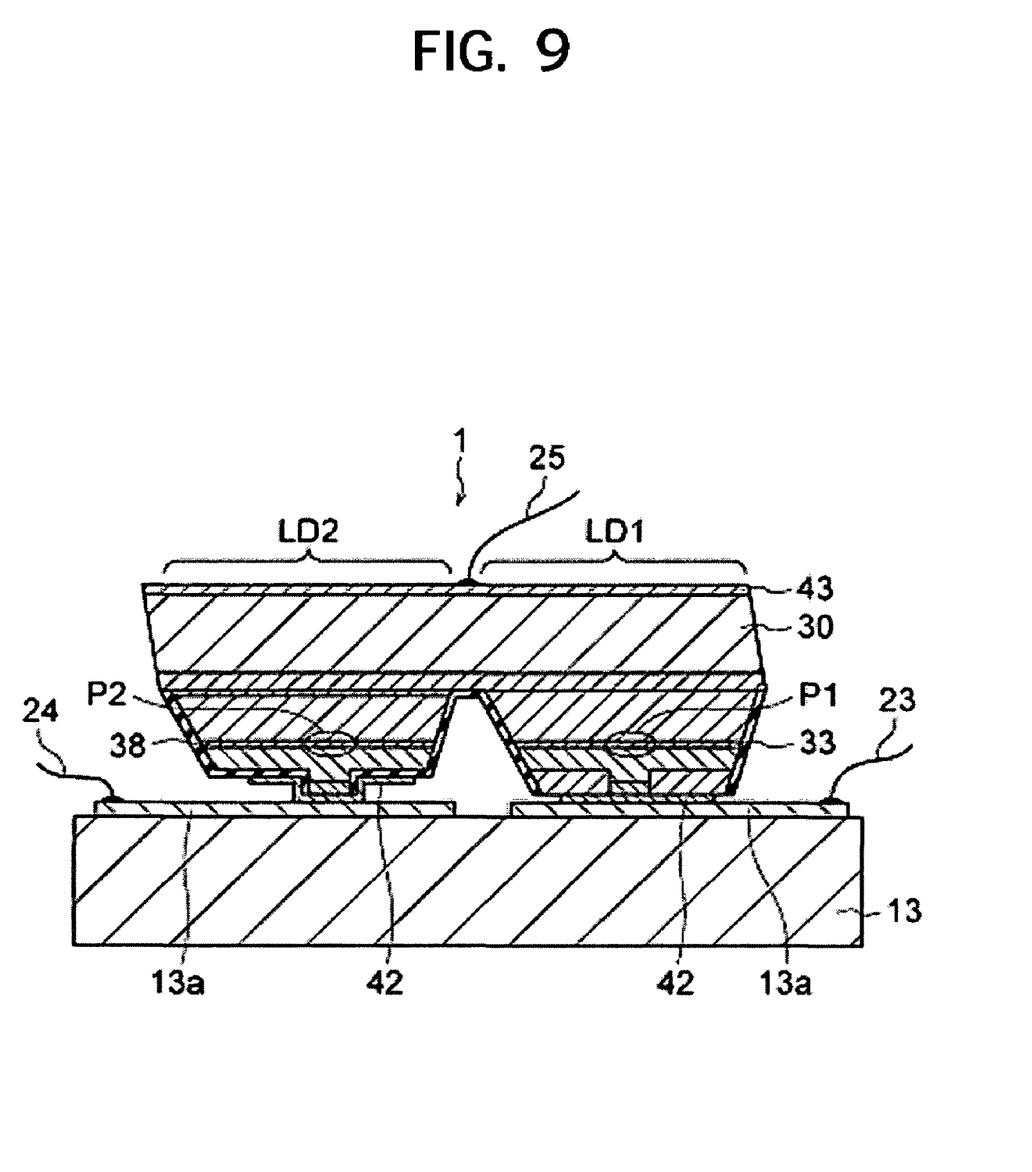
FIG. 9 is a sectional view of a semiconductor light emission device mounted on a sub mount.

FIG. 9 is a cross-sectional view of the semiconductor light emission device 1 mounted on the sub mount 13.

The semiconductor light emission device 1 is connected and fixed from the p-side electrode 42 side to an electrode 13a formed on the sub mount 13 by solder etc. The lead 23 is connected to the electrode 13a connected to the p-side electrode 42 of the first laser diode LD1. The lead 24 is connected to the electrode 13a connected to the p-side electrode 42 of the second laser diode LD2. The lead 25 is connected to the n-side electrode 43 common to the laser diodes LD1 and LD2.

In the semiconductor light emission device 1 mounted on the sub mount 13 described above, a first laser beam is emitted from a light emission point (light emission region) P1 in the first active layer 33 of the first laser diode LD1. Further, a second laser beam is emitted from a light emission point (light emission region) P2 in the second active layer 38 of the second laser diode LD2.

Figure 10A:
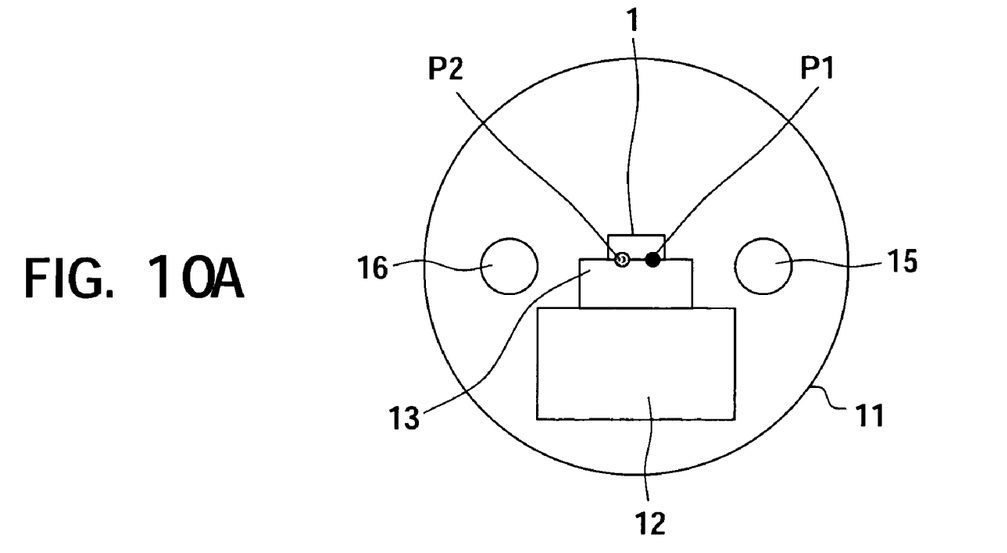
FIG. 10A is a plan view of the first package seen from the front side.
Figure 10B:
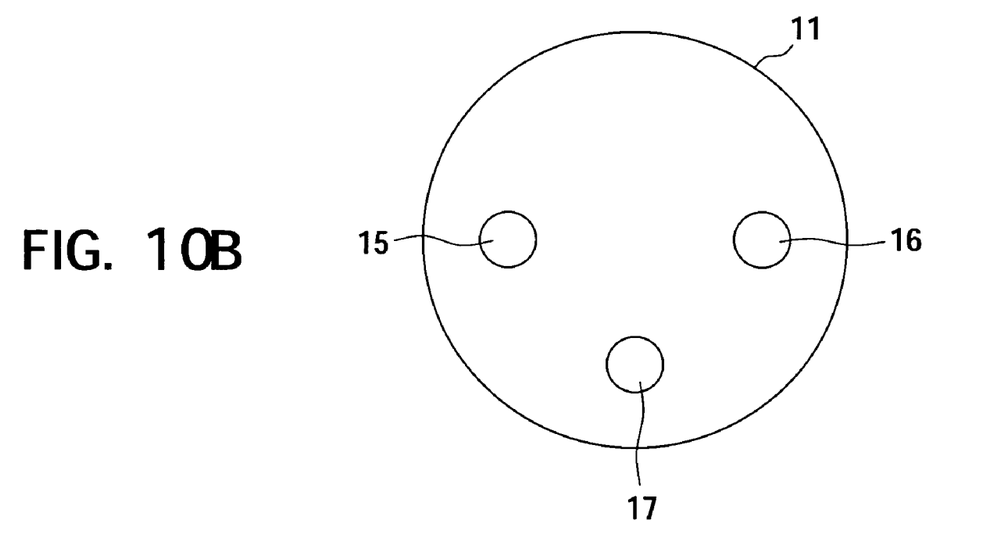
FIG. 10B is a plan view of the first package seen from the back side.

FIG. 10A is a plan view of the light emission apparatus 10 shown in FIG. 8 seen from the arrow Y1 side (light output side, front side), while FIG. 10B is a plan view of the light emission apparatus 10 shown in FIG. 8 seen from the arrow Y2 side (back side). Note that, in FIGS. 10A and 10B, the PIN diode use terminal 14 is omitted.

As shown in FIG. 10A, when viewed from the light output side, a light emission apparatus 10 is obtained in which the light emission point P1 of the first laser diode LD1 is arranged on the right side and the light emission point P2 of the second laser diode LD2 is arranged on the left side.

In the method of production of the semiconductor light emission devices described above, two types of semiconductor light emission devices having reverse arrangements of light emission points are produced. As shown in FIGS. 10A and 10B, where one semiconductor light emission device is mounted in a first package, the other semiconductor light emission device is mounted as shown in FIG. 11.

Figure 11A:
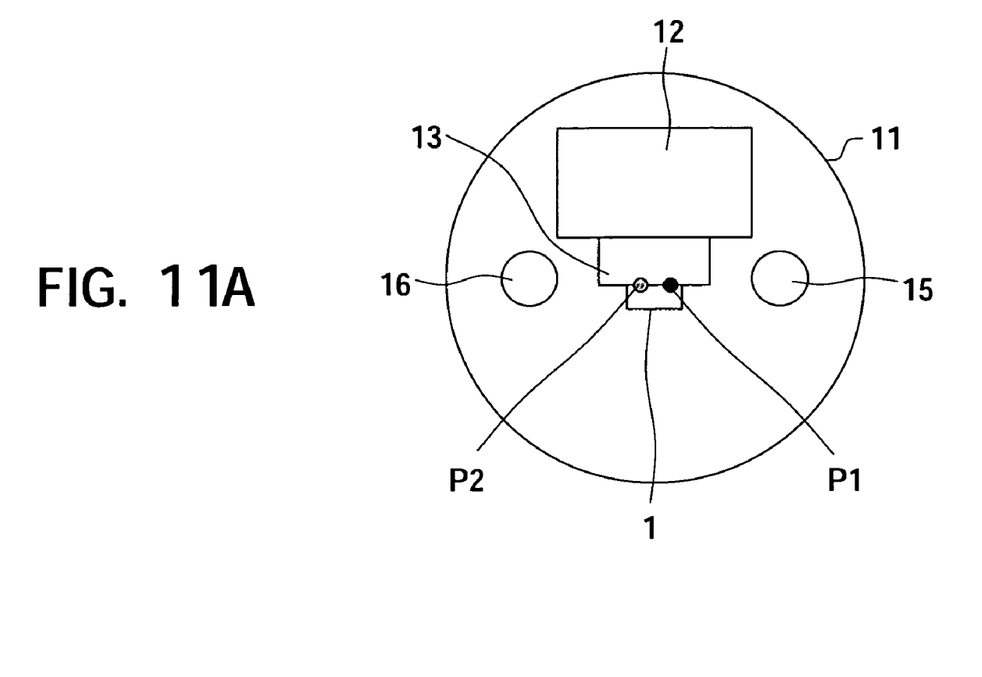
FIG. 11A is a plan view of a second package seen from the front side.
Figure 11B:
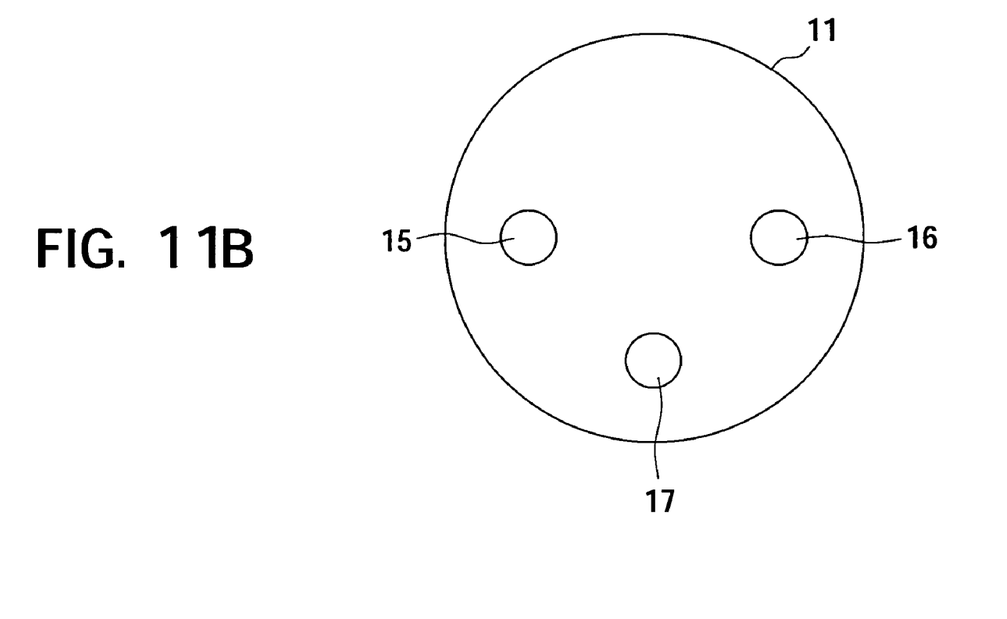
FIG. 11B is a plan view of the second package seen from the back side.

FIG. 11A is a plan view of the light emission apparatus produced by mounting the other semiconductor light emission device in a second package seen from the light output side (front side), while FIG. 11B is a plan view of the light emission apparatus seen from the back side. Note that, in FIGS. 11A and 11B, the PIN diode terminal 14 is omitted.

As shown in FIGS. 11A and 11B, the second package for mounting the other semiconductor light emission device has the same terminal arrangement, but is inverted in internal structure in comparison with the first package.

Namely, the internal structure of the second package is configured as the first package rotated 180° about the light output axis (direction vertical to the paper surface in the figure). In this way, the heat sink 12 and the sub mount 13 are arranged and the semiconductor light emission device 1 is mounted on the sub mount 13 inverted from the first package.

In this way, the orientation of the semiconductor light emission device 1 mounted in the second package is inverted in comparison with the semiconductor light emission device 1 in the first package. As a result, in a state mounted in the second package, the arrangement of the light emission points P1 and P2 of the semiconductor light emission device 1 becomes the same as the arrangement of light emission points P1 and P2 of the semiconductor light emission device 1 mounted in the first package.

Further, the first package and the second package become the same in the arrangements of the external terminals, that is, the PIN diode use terminal 14 (not shown), LD1 use terminal 15, LD2 use terminal 16, and common terminal 17, when seen from the back surface side of the package.

In this way, the arrangement of light emission points when seen from the light output surface side and the arrangement of external terminals when seen from the back surface side become the same, therefore one type of light emission apparatus is prepared as the light emission apparatus 10 formed by packaging the semiconductor light emission device 1.

Figure 12:
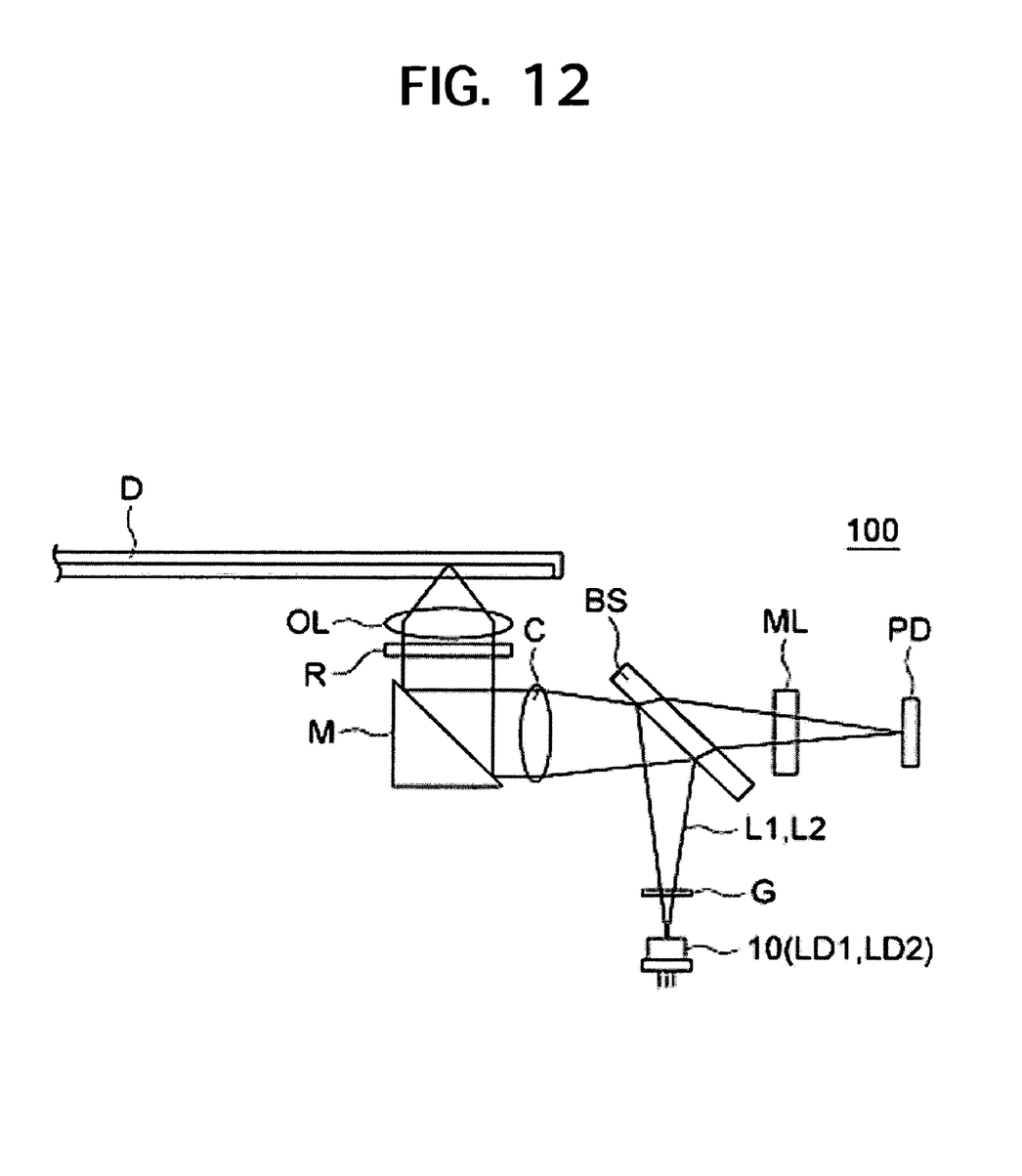
FIG. 12 is a view of the configuration of an optical pickup apparatus.

FIG. 12 is a view of the configuration when a light emission apparatus 10 packaging a semiconductor light emission device 1 is used in an optical system pickup apparatus in an optical disc system having different wavelengths for CDs and DVDs.

An optical pickup apparatus 100 has optical systems constituted individually, that is discretely, for example a light emission apparatus 10 having a first laser diode LD1 emitting a laser beam having a wavelength of for example the 780 nm band and a second laser diode LD2 emitting a laser beam having a wavelength of the 650 nm band, a grating G used for the 780 nm band and passing the laser beam of the 650 nm band therethrough, a beam splitter BS, a collimator C, a mirror M, a CD use opening limiting aperture R, an object lens OL, a multi lens ML, and a photodiode PD arranged at predetermined positions. In the photodiode PD, for example a first photodiode receiving the light of the 780 nm band and a second photodiode receiving the light of the 650 nm band are arranged in parallel adjacent to each other.

In the optical pickup apparatus 100 having the above configuration, the first laser beam L1 from the first laser diode LD1 passes through the grating G, is partially reflected by the beam splitter BS, passes through or is reflected at the collimator C, the mirror M, and the CD use opening restriction aperture R, and is focused onto the optical disc D by the object lens OL.

The light reflected from the optical disc D passes through the multi lens ML via the object lens OL, the CD use opening limiting aperture R, the mirror M, the collimator C, and the beam splitter BS and is projected onto the photodiode PD (first photodiode). By the change of this reflected light, the information recorded on the recording surface of the optical disc D such as a CD is read out.

On the other hand, the second laser beam L2 from the second laser diode LD2 follows the same route as that described above to be focused onto the optical disc D. The reflected light thereof is projected onto the photodiode PD (second photodiode). The information recorded on the recording surface of the optical disc D such as a DVD is read out by the change of this reflected light.

As explained above, by the method of production of light emission apparatuses according to the present embodiment, even in the case when two types of semiconductor light emission devices having reverse arrangements of light emission points are prepared, light emission apparatuses having the same arrangement of light emission points are prepared as packaged light emission apparatuses 10, therefore it is not necessary to change the arrangement of optical systems of the optical pickup apparatuses 100.

Further, by making the arrangements of the external terminals of the two light emission apparatuses 10 packaging two types of semiconductor light emission devices 1 the same, it becomes unnecessary to change the arrangement of power supply, so these can be handled as substantially the same type of light emission apparatus.

In this way, they can be regarded as the same type of light emission apparatus after packaging. Therefore, this can contribute to the yield of the method of production of semiconductor light emission devices.

The present invention is not limited to the explanation of the embodiment described above. In the present embodiment, an example concerning the most general monolithic two-wavelength laser was explained, but the present invention can also be applied to the case of a monolithic laser of three or more wavelengths. In the case of three or more wavelengths, it may be formed by reversing arrangements of the plurality of stripes of the multilayers having different emission wavelengths between adjacent semiconductor light emission device regions and forming two stripes of multilayers having the same emission wavelength adjacent across semiconductor light emission device regions. Namely, when defining stripes of multilayers having different emission wavelengths as A, B, and C, the stripes of the multilayers are formed in an order of arrangement such as A, B, C-C, B, A-A, B, C . . . . Due to this, stripes (for example, A, C) of the multilayer material for which a large area must be secured continue while sandwiching semiconductor light emission device regions. Then, by cleaving the substrate at the boundary of the semiconductor light emission device regions, semiconductor light emission devices individually providing stripes of multilayers having emission wavelengths different from each other are produced.

For example, in the present embodiment, an explanation was given by taking as an example a CAN package as the package, but the present invention can also be applied to mounting onto a package other than a CAN package. In this case as well, by mounting while inverting the semiconductor light emission device 1 front to back, arrangements of light emission points of two types of semiconductor light emission devices 1 can be made the same when seen from the light output side of the light emission apparatus.

Further, the semiconductor light emission device used in the present invention is not limited to laser diodes. Light emission diodes (LED) can also be employed. Further, the emission wavelengths of the first and second laser diodes are not limited to the 780 nm band and 650 nm band. A wavelength employed in another optical disc system can also be employed.

Further, it is also possible to form the first laser diode LD1 as a ridge type and form the second laser diode LD2 as an ion implantation type. It is also possible to give the ridge type or ion implantation type current confined path structure to both of the first laser diode LD1 and second laser diode LD2.

Other than this, various changes are possible within a range not out of the gist of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emission device production method in which stripes of two multilayers having different emission wavelengths for a plurality of devices are formed on a substrate, the method comprising the steps of:

depositing a first multilayer structure including an active layer on said substrate, said first multilayer structure useable to form a light emitting device which emits light of a first wavelength;

selectively etching said first multilayer structure to form a plurality of pairs of parallel adjoining stripes of said first multilayer structure;

depositing a second multilayer structure including an active layer on said substrate, said second multilayer structure useable to form a light emitting device which emits light of a second wavelength different than that of the first multilayer and said stripes of said first multilayer structure;

selectively etching said second multilayer structure to form a plurality of pairs of parallel adjoining stripes of said second multilayer structure on said substrate, a pair of stripes of said second multilayer structure being between pairs of said stripes of said first multilayer structure; and dividing said substrate between adjoining stripes of the pairs of stripes of said first multilayer structure also and between adjoining stripes of the pairs of stripes of said second multilayer structure to divide it into semiconductor light emission devices provided with a stripe of said first multilayer structure and and a stripe of said second multilayer structure.

2. A method of production of semiconductor light emission devices as set forth in claim 1, wherein said active layer of said first multilayer structure and said active layer of said second multilayer structure are formed by different materials.

3. A method of production of semiconductor light emission devices as set forth in claim 1, wherein in said step of depositing the first multilayer structure on the substrate and in the step of depositing the second multilayer structure on the substrate, a cladding layer of a first conductivity, an active layer, and a cladding layer of a second conductivity are deposited and different materials are used as said cladding layer of the first conductivity, said active layer, and second cladding layer of the second conductivity between said first multilayer structure and second multilayer structure.

4. A method of production of semiconductor light emission devices as set forth in claim 1, further comprising a step of forming a current confined path structure at said first multilayer structure and said second multilayer structure after the step of forming stripes of said second multilayer structure and before the step of dividing into semiconductor light emission devices.

5. A method of production of semiconductor light emission devices for forming stripes of a plurality multilayer structures having different emission wavelengths in semiconductor light emission device regions of a substrate and dividing said substrate between the semiconductor light emission device regions to form a plurality of semiconductor light emission devices, wherein the process of forming stripes of said plurality multilayer structures comprises repeating a depositing step of depositing a multilayer including an active layer on said substrate and a processing step of processing said multilayer structure to form stripes of said multilayer structure and reversing the arrangements of stripes of a plurality of multilayer structures having different emission wavelengths in adjoining pairs of semiconductor light emission device regions to form pairs of stripes of said multilayer structures having the same emission wavelength adjacent to each other between said semiconductor light emission device regions.

6. A method of production of semiconductor light emission devices as set forth in claim 5, wherein in said step of forming stripes of said plurality of multilayer structures, an active layer of a different material is formed for each multilayer structure of a different emission wavelength.

7. A method of production of semiconductor light emission devices as set forth in claim 5, wherein in said step of depositing a multilayer structure including an active layer on the substrate, a cladding layer of a first conductivity, an active layer, and a cladding layer of a second conductivity are deposited and different materials are used as said cladding layer of the first conductivity, said active layer, and second cladding layer of the second conductivity for each multilayer structure of a different emission wavelength.

8. A method of production of semiconductor light emission devices as set forth in claim 5, further comprising a step of forming a current confined path structure at each multilayer structure after the step of forming stripes of the multilayer structures and before the step of dividing said substrate.

* * * * *